(12) United States Patent
Timme et al.

(10) Patent No.: US 7,291,547 B2
(45) Date of Patent: Nov. 6, 2007

(54) FILTER DEVICE AND METHOD FOR FABRICATING FILTER DEVICES

(75) Inventors: Hans-Jörg Timme, Ottobrunn (DE); Robert Aigner, Unterhaching (DE); Lüder Elbrecht, München (DE); Juha Sakari Ellä, Halikko (FI); Katri Helena Pohjonen, Espoo (FI); Pasi Tikka, Munich (DE)

(73) Assignees: Infineon Technologies A.G., Munich (DE); Nokia Corporation, Espoo (FI)

( * ) Notice: Subject to any disclaimer, the term of this patent is extended or adjusted under 35 U.S.C. 154(b) by 258 days.

(21) Appl. No.: 10/623,068

(22) Filed: Jul. 18, 2003

(65) Prior Publication Data

US 2004/0029356 A1 Feb. 12, 2004

Related U.S. Application Data

(63) Continuation of application No. PCT/EP01/00554, filed on Jan. 18, 2001.

(51) Int. Cl.
*H01L 21/44* (2006.01)
(52) U.S. Cl. ............... 438/612; 438/108; 257/704; 257/737; 257/E23.201
(58) Field of Classification Search ........ 257/707–737, 257/690, 704; 438/108, 455, 612, 613
See application file for complete search history.

(56) References Cited

U.S. PATENT DOCUMENTS

| | | | | |
|---|---|---|---|---|
| 4,409,570 A | * | 10/1983 | Tanski | 333/187 |
| 5,287,036 A | * | 2/1994 | Penunuri | 310/313 R |
| 5,475,348 A | * | 12/1995 | Hode et al. | 333/195 |
| 5,631,515 A | * | 5/1997 | Mineyoshi et al. | 310/313 B |
| 5,824,569 A | | 10/1998 | Brooks et al. | |
| 5,851,845 A | | 12/1998 | Wood et al. | |
| 5,932,950 A | * | 8/1999 | Yamada et al. | 310/313 D |
| 6,078,229 A | * | 6/2000 | Funada et al. | 333/193 |
| 6,249,049 B1 | * | 6/2001 | Kamada et al. | 257/703 |
| 6,445,265 B1 | * | 9/2002 | Wright | 333/193 |
| 6,621,163 B2 | * | 9/2003 | Weekamp et al. | 257/737 |
| 6,703,763 B2 | * | 3/2004 | Tsai et al. | 310/318 |
| 6,720,846 B2 | * | 4/2004 | Iwashita et al. | 333/193 |
| 6,734,601 B2 | * | 5/2004 | Taga | 310/313 R |

FOREIGN PATENT DOCUMENTS

| | | |
|---|---|---|
| EP | 0 609 062 A1 | 8/1994 |
| EP | 1 070 677 A2 | 1/2001 |
| EP | 1 071 126 A2 | 1/2001 |

* cited by examiner

*Primary Examiner*—Alexander Ghyka
(74) *Attorney, Agent, or Firm*—Laurence A. Greenberg; Werner H. Stemer; Ralph E. Locher

(57) ABSTRACT

A filter device and a method for fabricating filter devices can package filters, especially acoustic wave filters, by bonding a carrier (substrate) wafer carrying manufactured filters to another wafer referred to as a capping wafer. A capping wafer/substrate eliminates the need for a conventional package to protect the sensitive filters, which reduces both product size and product costs significantly. Even though additional packaging is possible (i.e. in plastic molded packages, or in glob-top packages), it is not required for the reliability of the filters.

32 Claims, 8 Drawing Sheets

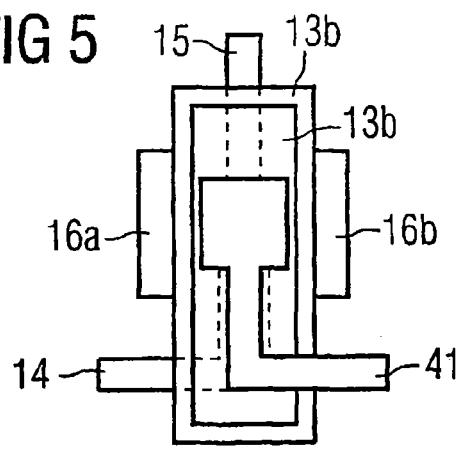
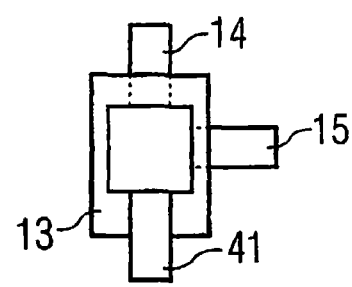
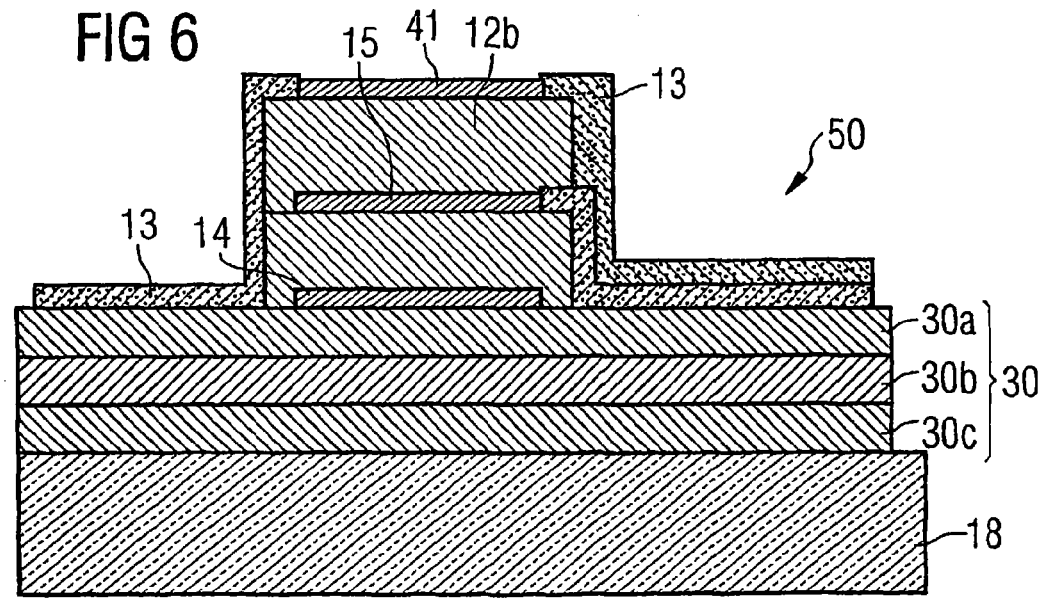

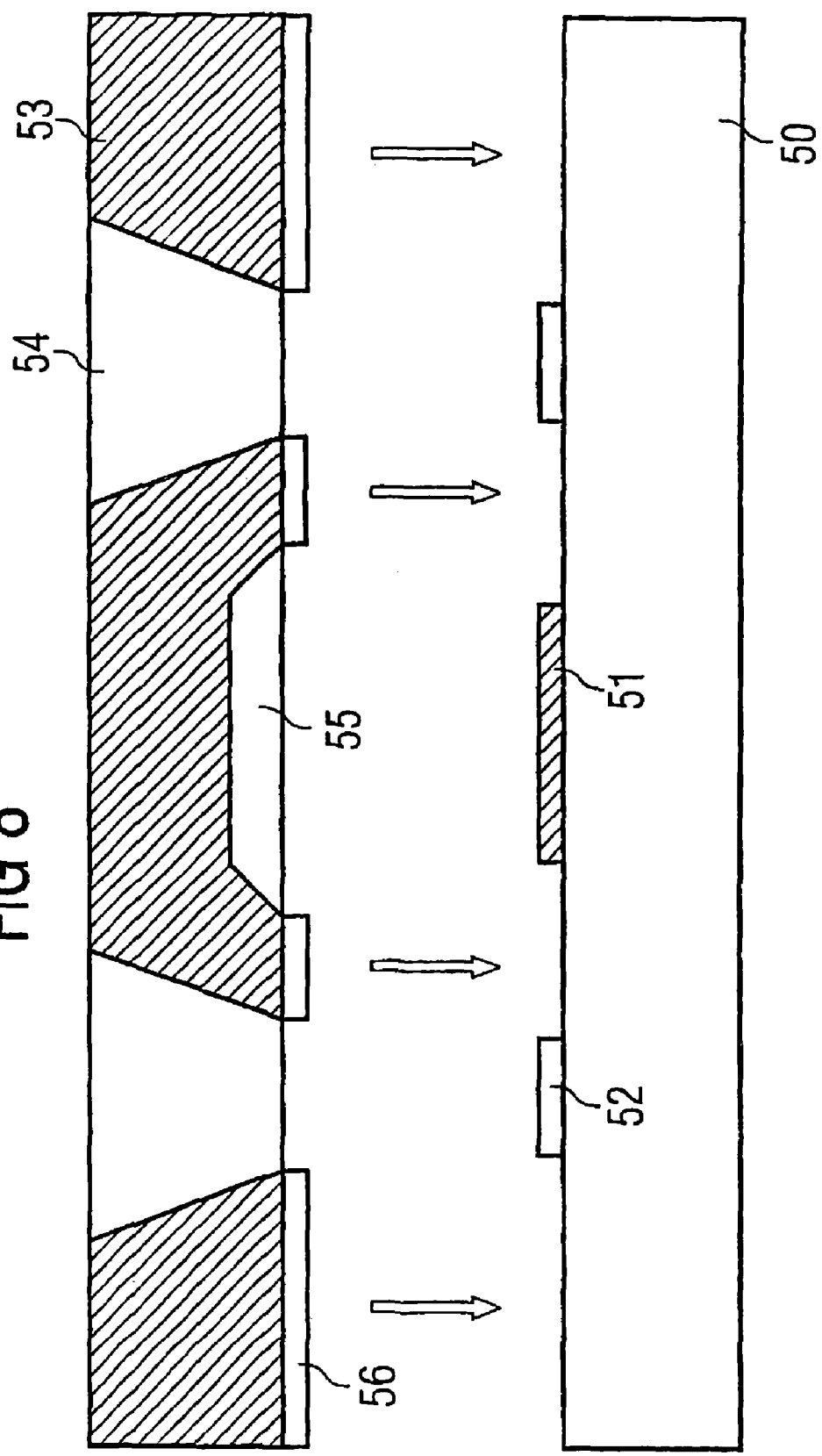

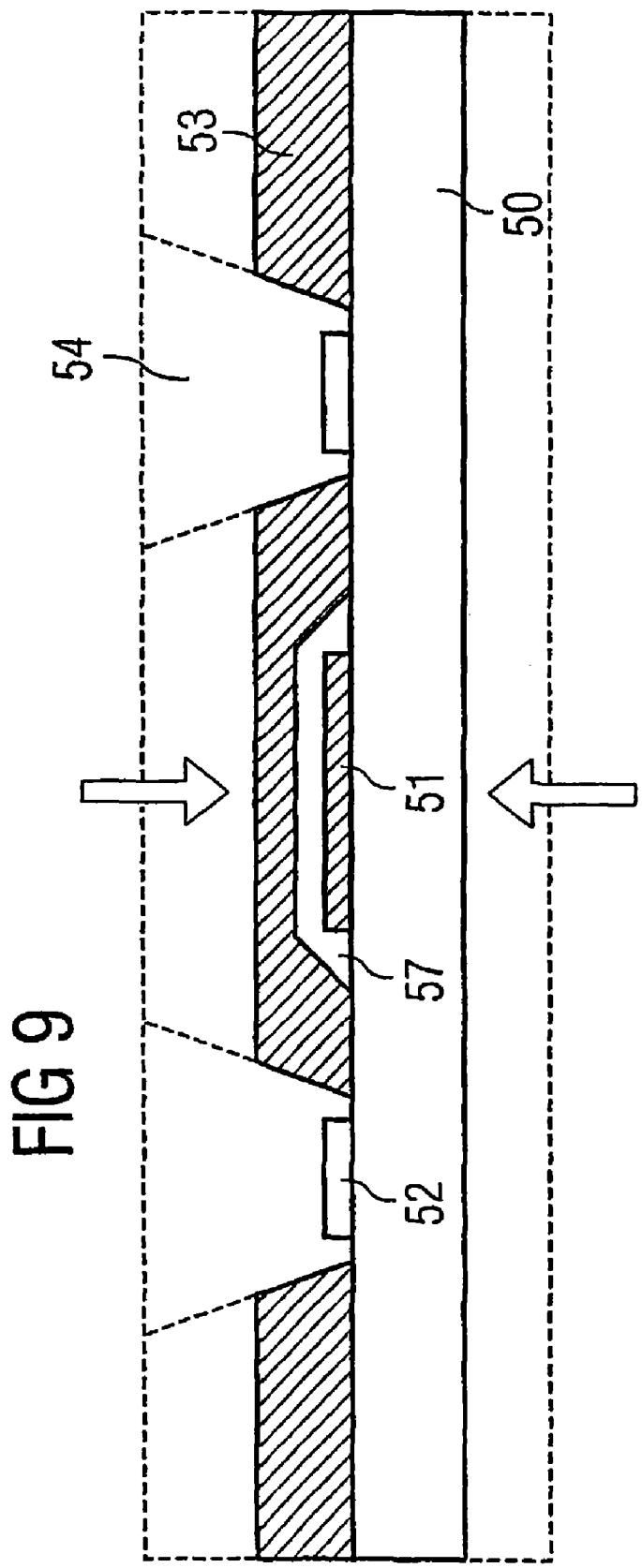

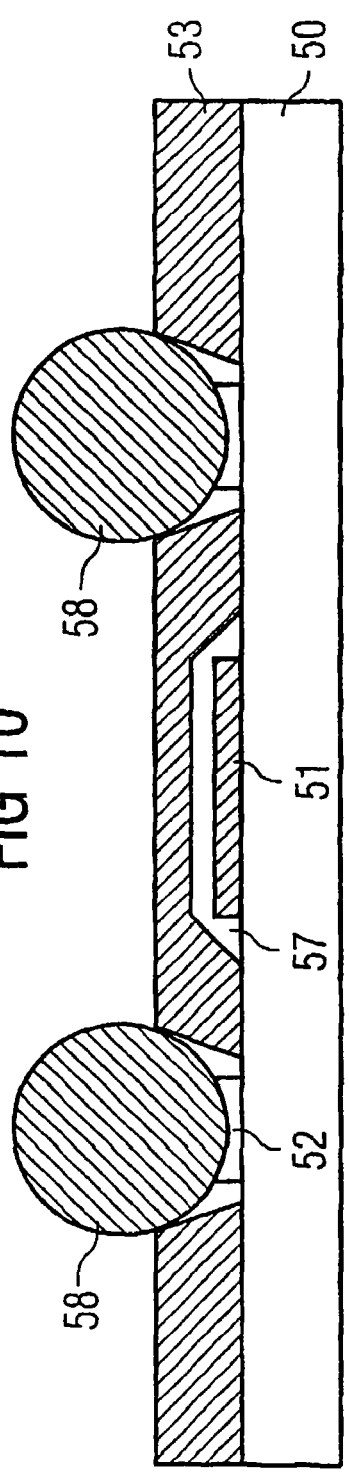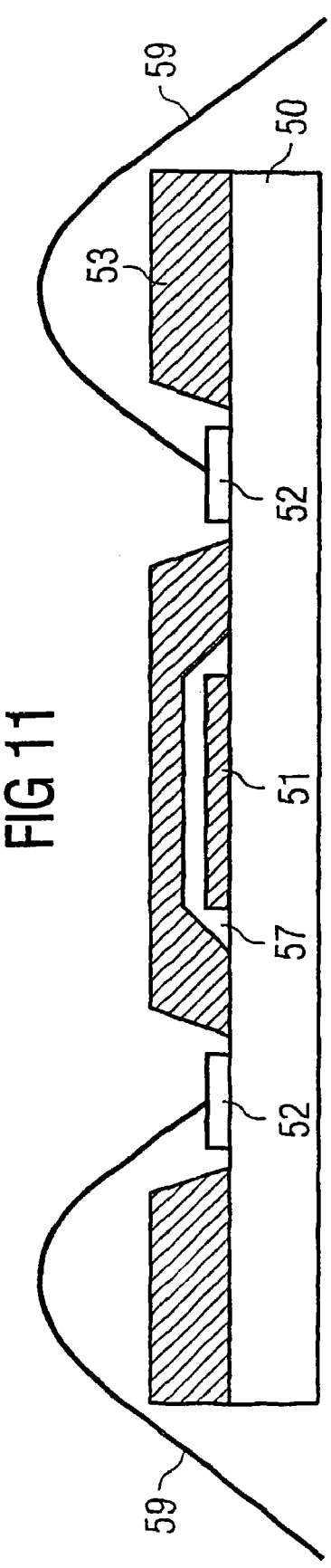

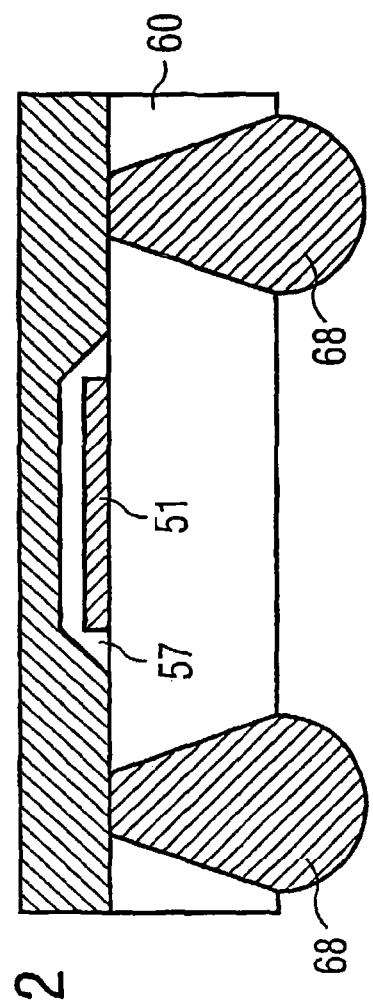
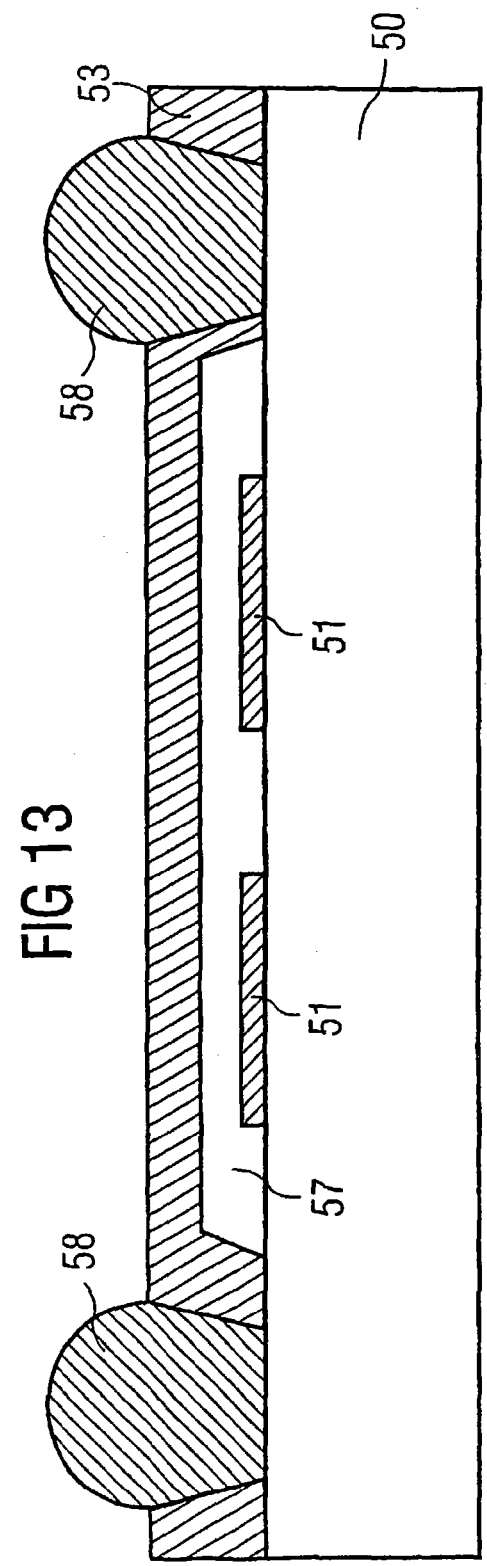

FILTER DEVICE AND METHOD FOR FABRICATING FILTER DEVICES

CROSS-REFERENCE TO RELATED APPLICATION

This application is a continuation of copending International Application No. PCT/EP01/00554, filed Jan. 18, 2001, which designated the United States and was published in English.

BACKGROUND OF THE INVENTION

Field of the Invention

The present invention relates to filter devices. The present invention especially relates to acoustic wave filter devices, e.g. Surface Acoustic Wave (SAW) filter devices, Bulk Acoustic Wave (BAW) filter devices and/or Stacked Crystal Filter (SCF) devices. Furthermore, the present invention relates to a method for fabricating filter devices.

The need for using miniature and high performance filters in wireless communication devices has led to the widespread usage of Surface Acoustic Wave (SAW) filters. Bulk Acoustic Wave (BAW) filters can also be used in addition to Surface Acoustic Wave (SAW) filters. Bulk Acoustic Wave (BAW) filters typically include several Bulk Acoustic Wave (BAW) resonators. In a Bulk Acoustic Wave (BAW) filter, acoustic waves propagate in a direction that is perpendicular to the layer surfaces of the filter. In contrast, acoustic waves which propagate within a Surface Acoustic Wave (SAW) filter do so in a direction that is parallel to the layer surfaces of the filter.

It is known to fabricate monolithic filters that include at least a Bulk Acoustic Wave (BAW) resonator device (also known in the art as "Thin Film Bulk Acoustic Wave Resonators (FBARs)"). Presently, there are primarily two known types of Bulk Acoustic Wave devices, namely BAW resonators and Stacked Crystal Filters (SCFs). One difference between Bulk Acoustic Wave (BAW) resonators and Stacked Crystal Filters (SCFs) is the number of layers that are included in the structures of the respective devices. For example, Bulk Acoustic Wave (BAW) resonators typically include two electrodes and a single piezoelectric layer that is disposed between the two electrodes. One or more membrane layers may also be employed between the piezoelectric layer and a substrate of the respective devices. Stacked Crystal Filter (SCF) devices, in contrast, typically include two piezoelectric layers and three electrodes. In the Stacked Crystal Filter (SCF) devices, a first one of the two piezoelectric layers is disposed between a first, lower one of the three electrodes and a second, middle one of the three electrodes, and a second one of the piezoelectric layers is disposed between the middle electrode and a third, upper one of the three electrodes. The middle electrode is generally used as a grounding electrode.

Bulk Acoustic Wave (BAW) filters can be fabricated to include various known types of Bulk Acoustic Wave (BAW) resonators. Those known types of Bulk Acoustic Wave (BAW) resonators include three basic portions. A first one of the portions, which is used to generate acoustic waves, includes an acoustically-active piezoelectric layer. That layer may be formed, for example, of zinc-oxide (ZnO), aluminum nitride (AlN), zinc-sulfur (ZnS) or any other suitable piezoelectric material that can be fabricated as a thin film. A second one of the portions includes electrodes that are formed on opposite sides of the piezoelectric layer. A third portion of the Bulk Acoustic Wave (BAW) resonator includes a mechanism for acoustically isolating the substrate from vibrations produced by the piezoelectric layer. Bulk Acoustic Wave (BAW) resonators are typically fabricated on silicon, gallium arsenide, or glass substrates using thin film technology (e.g., sputtering, chemical vapor deposition, etc.). Bulk Acoustic Wave (BAW) resonators exhibit series and parallel resonances that are similar to those of crystal resonators, for example. Resonant frequencies of Bulk Acoustic Wave (BAW) resonators can typically range from about 0.5 GH to 5 GHz, depending on the layer thicknesses of the devices.

If a contaminating or otherwise harmful external material comes into contact with any of those layers, the performance of the Bulk Acoustic Wave (BAW) filters can become degraded. In order to avoid that problem, those layers are typically protected by using a semi-hermetic packaging. Packaging of SAW or BAW filters is special because of the need to have a sealed cavity above the active filter structures. The reason therefor is that any package-or passivation material that would come into contact with the surface of acoustically active structures will start to vibrate itself and thus propagate acoustic waves and dissipate energy outside the active structures. The effects would include at least reduction of quality factors Q, shift of resonance or passband frequencies, increase of insertion loss or complete non-functionality at all. Therefore, acoustic wave filter devices (e.g. SAW and/or BAW) cannot be packaged into standard plastic mold packages, for example, and it is hard to construct chip-scale packages for them.

One known method of protecting those layer surfaces during assembly includes assembling the filters by using, for example, flip-chip technology in a hermetic environment. As can be appreciated, that technique can be tedious to perform. Another known method of protecting layer surfaces of SAW filters includes packaging the SAW filters in hermetically sealed ceramic packages. After being packaged in that manner, the SAW filters can then be surface mounted to a circuit board. Unfortunately, the costs of using semi-hermetic packaging can be high. Thus, it would be desirable to provide a novel, inexpensive technique for protecting those surfaces.

SUMMARY OF THE INVENTION

It is accordingly an object of the invention to provide a filter device and a method for fabricating filter devices, which overcome the hereinafore-mentioned disadvantages of the heretofore-known devices and methods of this general type.

With the foregoing and other objects in view there is provided, in accordance with the invention, a method of fabricating filter devices. The method comprises the steps of providing a carrier wafer carrying a plurality of filters, providing a capping wafer, bonding the capping wafer to the carrier wafer, with the filters disposed in cavities between the carrier wafer and the capping wafer, and separating the bonded wafers into single filter devices. Each single filter device has a carrier substrate carrying at least one filter and a capping substrate. The at least one filter is disposed in at least one cavity between the carrier substrate and the capping substrate.

With the objects of the invention in view, there is also provided a filter device, comprising a carrier substrate, at least one filter carried by the carrier substrate, and a capping substrate. The carrier substrate and the capping substrate define at least one cavity therebetween containing the at least one filter.

Due to the use of a capping wafer/substrate no conventional package is needed to protect the sensitive filters, which reduces both product size and product costs significantly. Even though additional packaging is possible (i.e. in plastic molded packages, or in glob-top packages), it is not required for the reliability of the filters. A lot of different wafer-bonding techniques are available, so that for many substrate and/or capping wafer materials an optimal package can be provided. According to the present invention, the capping of the sensitive filters, especially the sensitive acoustic wave filters, is be performed on the wafer-level, i.e. in one process step for thousands of filters on a single wafer (batch processing).

The wafer capping can be performed within the wafer fab where the clean room facilities are best and allow one to achieve and to maintain optimal surface conditions for the filters (i.e. minimal particulate contamination). Wafer-level packaging according to the present invention allows one to dice the wafers after the packaging process, i.e. when the filter structures are already sealed inside a cavity. Thus, no additional protection of the filter surface is needed. In contrast, all conventional packaging processes require one to singulate the individual chips before the packaging process, which requires protection of the filter surfaces during the usually quite dirty sawing process. Furthermore, the formation of the interconnects (e.g. bumping) of the combined wafer can be performed by using available standard techniques because of the complete protection/sealing of the filters.

The present invention basically avoids all of the problems that conventional packaging methods cause for acoustic wave filters due to their need for an acoustic decoupling between device surface and package. The resulting filter device can then be used and assembled like standard chips using, for example, wire bonding or a flip-chip technology.

In accordance with another feature of the invention, packaging of the filters, especially the acoustic wave filters, is performed by bonding the carrier (substrate) wafer carrying the manufactured filters with another wafer, called a capping wafer. In principle, several wafer-bonding techniques are known for substrate materials that are used in the semiconductor industry. For example, silicon substrate wafers can be bonded with silicon capping wafers or with glass capping wafers (such as PYREX, which is well adapted to silicon with respect to thermal expansion coefficient). Wafer bonding techniques include silicon direct bonding, anodic bonding, eutectic bonding, solder bonding, and gluing.

In accordance with a further feature of the invention, either the capping wafer, or the carrier wafer, or both wafers are structured/patterned with a certain topography which guarantees that the filters are positioned well in a protecting sealed cavity after the bonding process. This patterning can preferably be done by micromaching techniques, for example, which are also already established for semiconductor or glass materials.

In accordance with an added feature of the invention, the combined wafers can be ground and/or etched from either the top side, or the bottom side, or even both sides, after the wafer-bonding process, in order to reduce the height of the wafer-level package to a minimum. Preferably, basic contact pads/metallizations or plating bases are protected during such thinning. Once the combined wafer is thinned, it is preferred that the contact pads/plating bases be enhanced by metal deposition or by electroplating processes.

In accordance with an additional feature of the invention, so called "bumps" can be produced that are in contact with the pad metallization and that are large enough in diameter to allow for a stable assembly process on the customer's circuitry board.

Solder bumps and/or metal bumps can be respectively created by using different methods such as, for example:

Electroplating of alloys or of individual metals followed by a melting process;

Vapor-deposition under vacuum;

Chemical deposition (using auto-catalytic Ni processes, for example);

Solder transfer, that is electroplating of solder material onto a structured temporary support target/wafer, followed by a transfer of the material deposits onto the substrate wafer (for example by heating of the solder material above the melt temperature);

Use of nailhead bonds placed by a wire-bonder (wires made of Au, or PbSn, or SnAg, for example);

Solder-ball bumpers, that is placement of (preformed) solder balls (such as PbSn or AuSn) on top of the pads with UBM (such as NiAu), in a first step. In a second step, a placed solder ball will be melted by using a laser pulse (from a ND-YAG laser, for example).

In accordance with yet another feature of the invention, there are provided additional filters, especially acoustic wave filters, and/or active/passive ICs placed as flip-chips on top of the carrier wafer within the cavity/cavities protected by the capping wafer.

In accordance with a concomitant feature of the invention, there are provided additional passive components, e.g. capacitances and/or inductivities, on the capping wafer.

Other features which are considered as characteristic for the invention are set forth in the appended claims.

Although the invention is illustrated and described herein as embodied in a filter device and a method for fabricating filter devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a top-plan view of a portion of the Stacked Crystal Filter (SCF) of FIG. 4;

FIG. 6 is a cross-sectional view of an exemplary solidly-mounted Stacked Crystal Filter (SCF) that includes an acoustic mirror;

FIG. 7 is a top-plan view of a portion of the Stacked Crystal Filter (SCF) of FIG. 6;

FIGS. 8 to 10 are cross-sectional views illustrating a method of fabricating filter devices according to one embodiment of the present invention;

FIG. 11 is a cross-sectional view of a filter device according to another embodiment of the present invention;

FIG. 12 is a cross-sectional view of a filter device according to a further embodiment of the present invention;

FIG. 13 is a cross-sectional view of a filter device according to an added embodiment of the present invention.

DESCRIPTION OF THE PREFERRED EMBODIMENTS

Figure 1:
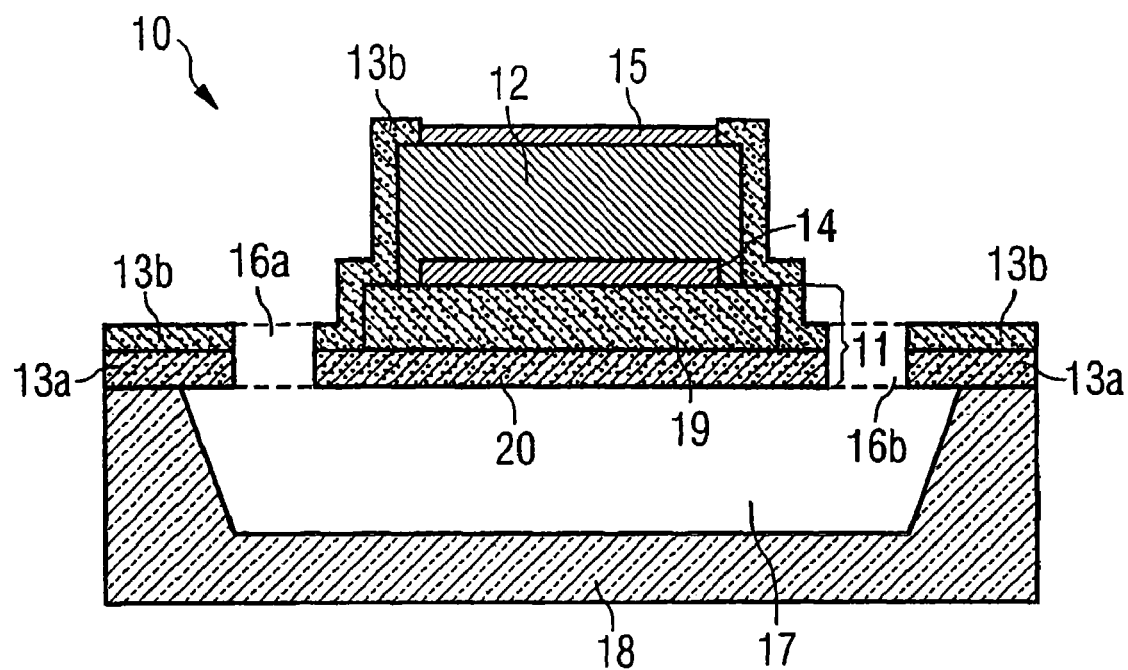
FIG. 1 is a diagrammatic, cross-sectional view of an exemplary Bulk Acoustic Wave (BAW) resonator that includes an air gap.
Figure 2:
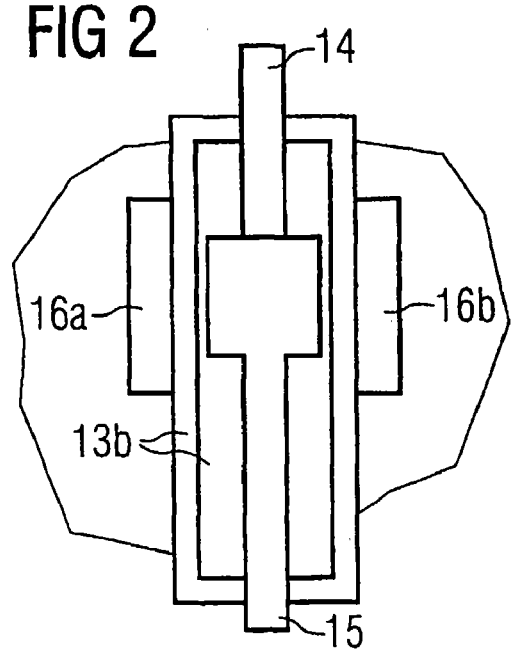
FIG. 2 is a fragmentary, top-plan view of the Bulk Acoustic Wave (BAW) resonator of FIG. 1.

Referring now to the figures of the drawings in detail and first, particularly, to FIGS. 1 and 2 thereof, there are seen respective cross-sectional side and top-plan views of a Bulk Acoustic Wave (BAW) resonator 10 having a membrane or bridge structure 11. The Bulk Acoustic Wave (BAW) resonator 10 includes a piezoelectric layer 12, a first protective layer 13a, a second protective layer 13b, a first electrode 14, a second electrode 15, the membrane 11, etch windows 16a and 16b, an air gap 17 and a substrate 18. The piezoelectric layer 12 is formed, for example, of a piezoelectric material that can be fabricated as a thin film such as, for example, zinc-oxide (ZnO) or aluminum-nitride (AlN).

The membrane 11 includes two layers, namely a top layer 19 and a bottom layer 20. The top layer 19 is made, for example, of poly-silicon or aluminum-nitride (AlN), and the bottom layer 20 is made, for example, of silicon-dioxide ($SiO_2$) or gallium arsenide (GaAs). The substrate 18 is formed of a material such as, for example, silicon (Si), $SiO_2$, GaAs, or glass. A portion of the substrate 18 is etched through the etch windows 16a and 16b to form the air gap 17 after the membrane layers have been deposited over the substrate 18.

Figure 3:
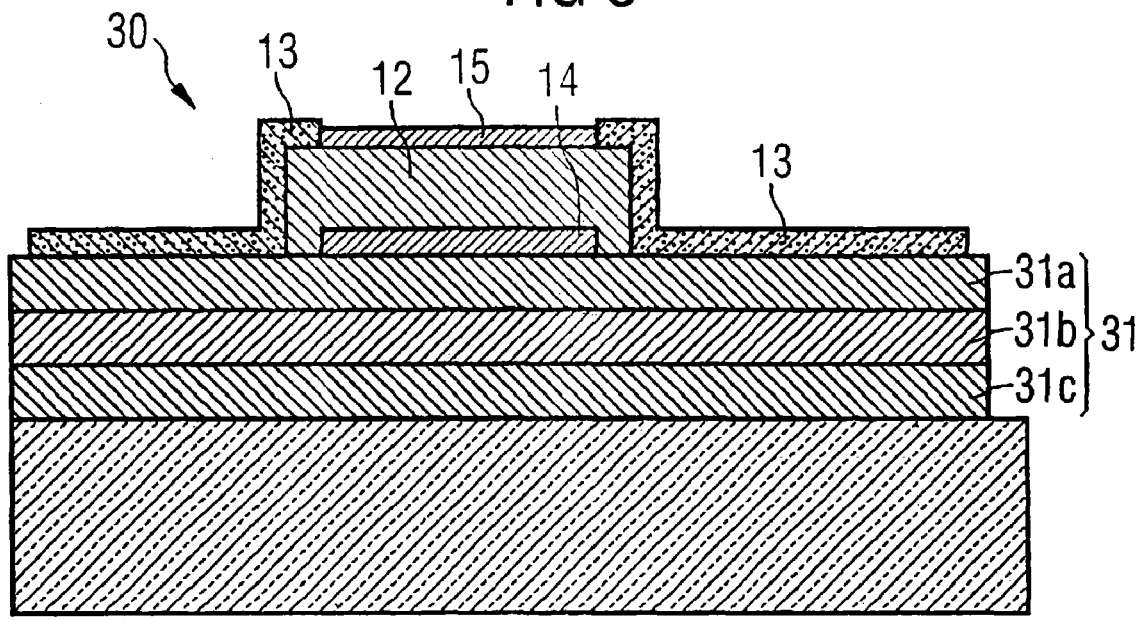
FIG. 3 is a cross-sectional view of an exemplary Bulk Acoustic Wave (BAW) resonator that includes an acoustic mirror.

Another Bulk Acoustic Wave (BAW) resonator 30 is shown in FIG. 3. This resonator 30 has a similar structure to that of the Bulk Acoustic Wave (BAW) resonator 10 of FIG. 1, except that only a single protective layer 13 is provided. In addition, the membrane 11 and the air gap 17 are replaced by an acoustic mirror 31 which acoustically isolates vibrations produced by the piezoelectric layer 12 from the substrate 18.

The acoustic mirror 31 preferably includes an odd number of layers (e.g., from three to nine layers). The acoustic mirror 31 shown in FIG. 3 includes three layers, namely a top layer 31a, a middle layer 31b and a bottom layer 31c. Each layer 31a, 31b and 31c has a thickness that is, for example, approximately equal to one quarter wavelength. The top layer 31a and the bottom layer 31c are made of materials having low acoustic impedances such as, for example, silicon (Si), poly-silicon, aluminum (Al) or a polymer. In addition, the middle layer 31b is made of a material having a high acoustic impedance such as, for example, gold (Au), molybdenum (Mo) or tungsten (W). The ratio of the acoustic impedances of consecutive layers is large enough to permit the impedance of the substrate to be transformed to a lower value. As a result, the substrate 18 may be formed of various high acoustic impedance materials or low acoustic impedance materials (e.g., Si, $SiO_2$, GaAs, glass, or a ceramic material).

Figure 4:
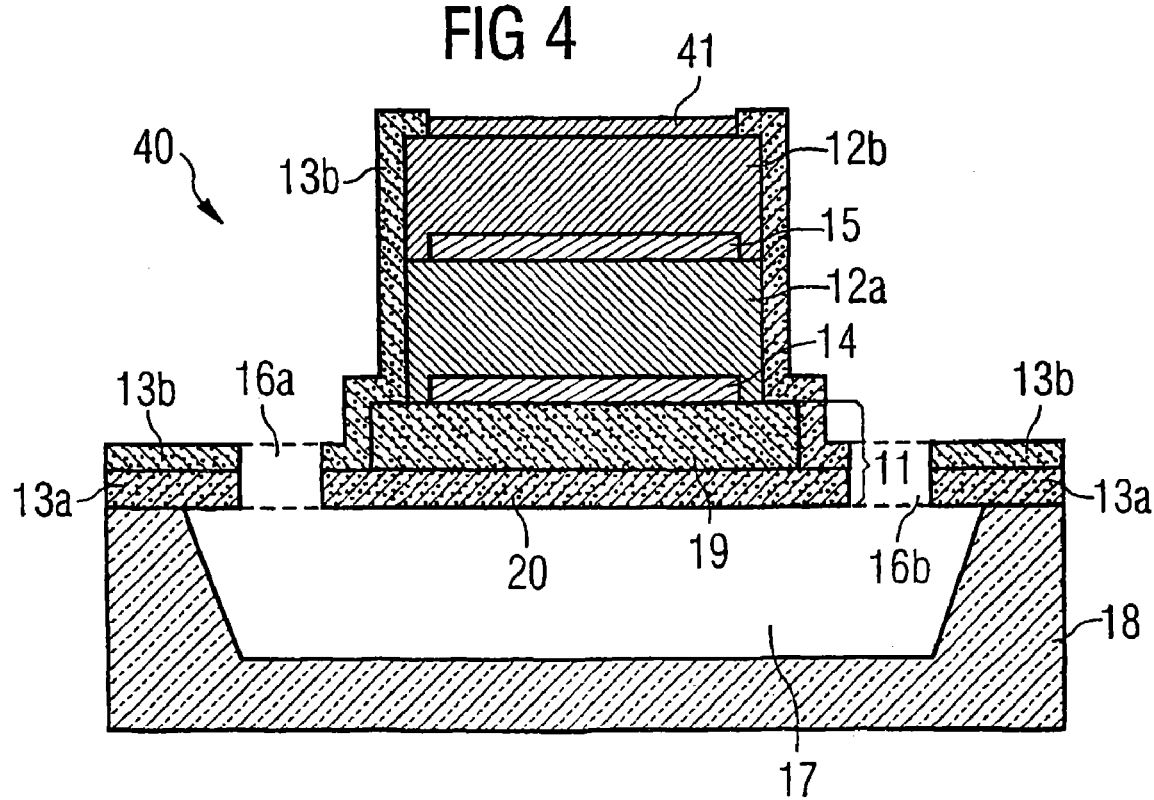
FIG. 4 is a cross-sectional view of an exemplary Stacked Crystal Filter (SCF) that includes an air gap.

Reference will now be made to FIGS. 4 to 7, which show various embodiments of another type of BAW device, namely a Stacked Crystal Filter (SCF). FIGS. 4 and 5 show a Stacked Crystal Filter (SCF) 40. The Stacked Crystal Filter (SCF) 40 includes a first piezoelectric layer 12a, a first protective layer 13a, a second protective layer 13b, a first electrode 14, a second electrode 15, the membrane 11, etch windows 16a and 16b, an air gap 17 and a substrate 18. The piezoelectric layer 12a is formed, for example, of a piezoelectric material that can be fabricated as a thin film such as, for example, zinc-oxide (ZnO) or aluminum-nitride (AlN). The second, middle electrode 15 is therefore usually employed as a ground electrode.

In addition to these layers, the Stacked Crystal Filter 40 also includes an additional piezoelectric layer 12b that is disposed over the second electrode 15 and over portions of the first piezoelectric layer 12a. Furthermore, the Stacked Crystal Filter (SCF) 40 includes a third, upper electrode 41 that is disposed over a top portion of the piezoelectric layer 12b. The electrode 41 may be formed of similar materials to the electrodes 14 and 15, and the piezoelectric layers 12b may be formed of similar materials to the piezoelectric layer 12a.

FIG. 6 shows a solidly-mounted Stacked Crystal Filter 50 that is similar to the Stacked Crystal Filter 40 shown in FIG. 4. However, instead of an air gap 17, the solidly-mounted Stacked Crystal Filter 50 includes an acoustic mirror 30 which acoustically isolates vibrations produced by the piezoelectric layers 12a and 12b from the substrate 18. As described with respect to FIG. 3, the acoustic mirror 30 preferably includes an odd number of layers (e.g., from three to nine layers). The acoustic mirror 30 shown in FIG. 6 also includes three layers, namely a top layer 30a, a middle layer 30b and a bottom layer 30c. Each layer 30a, 30b and 30c has a thickness that is, for example, approximately equal to one quarter wavelength. The top layer 30a and the bottom layer 30c are made of materials having low acoustic impedances such as, for example, silicon (Si), poly-silicon, aluminum (Al) or a polymer. Additionally, the middle layer 30b is made of a material having a high acoustic impedance such as, for example, gold (Au), molybdenum (Mo) or tungsten (W). It should be noted that a non-illustrated membrane or tuning layer may also be provided between the acoustic mirror 30 and the electrode 14 of the device 50, if needed for tuning the device 50 to enable it to provide desired frequency response characteristics.

FIGS. 8 to 10 show a method of fabricating filter devices according to a first embodiment of the present invention.

As shown in FIG. 8, a silicon carrier wafer 50 is provided, which already contains a finalized acoustic wave filter 51. The acoustic wave filter 51 can be selected from a wide range of different acoustic wave filter types such as Surface Acoustic Wave (SAW) filters, Bulk Acoustic Wave (BAW) filters and/or Stacked Crystal Filters (SCF). Preferably, the acoustic wave filter 51 includes at least one Bulk Acoustic Wave (BAW) resonator and/or Stacked Crystal Filters (SCF) as described with respect to FIGS. 1 to 7. In addition to the acoustic wave filter 51, the carrier wafer 50 includes a non-illustrated integrated circuit (IC), preferably a radio-frequency integrated circuit (RF-IC). Furthermore, the carrier wafer 50 includes pads 52 which are later used to connect the acoustic wave filter 51 to the outside world.

In order to protect the acoustic wave filter 51 from contaminating or otherwise harmful external material, a silicon capping wafer 53 is provided, which will be bonded to the carrier wafer 50. In the present embodiment, the capping wafer 53 is structured to provide pad openings 54 and a recess 55, so that a cavity for the acoustic wave filter 51 is provided once the wafer bonding process is finished. A layer 56 of solder material is provided on a surface of the capping wafer 53 which confronts the carrier wafer 51.

In the present embodiment, an AuSi layer is provided as solder material. Preferably, the wafer bonding is compatible to a temperature budget in later processing, i.e. as seen during a reflow process of bump formation and reflow soldering during assembly of the product later on. The process according to the present embodiment ensures this by using AuSi eutectic bonding for the wafer bonding process, because the AuSi eutectic temperature T=363° C. is well above the melting point of alloys like Sn/Pb (T=183° C. for composition 63/37) and typical reflow temperatures around 230° C. as used in later process stages.

After the AuSi eutectic wafer bonding process is finished, the acoustic wave filter 51 is disposed in the recess 55 located between the carrier wafer 50 and the capping wafer 53. Due to the shape of the recess 55 in the capping wafer 53 and the nature of the AuSi eutectic wafer bonding process, the acoustic wave filter 51 is hermetically sealed within recess 55. Accordingly, a high reliability of the acoustic wave filter 51 can be guaranteed. The AuSi eutectic wafer bonding process is preferably performed within the wafer fab where the clean room facilities are best and allow one to achieve and to maintain optimal surface conditions for the acoustic wave filter 51 (i.e. minimal particulate contamination).

Following the AuSi eutectic wafer bonding process, the combined wafer 50, 53 is ground on both sides, in order to reduce the height of the wafer-level package to a minimum. Preferably, non-illustrated basic contact pads/metallizations or plating bases are protected during such thinning. The resulting structure is shown in FIG. 9.

Interconnections are produced following the thinning process. According to the present embodiment, a so called "bumping process" is used to fabricate the interconnections. Bumping processes usually require some non-illustrated under-bump metallization (UBM), which has already been deposited on the pads 52 before the wafer bonding. Preferably, a structured deposition of bump materials (bump deposits) using selective deposition methods, such as microform electroplating or lift-off techniques, is performed. Thereafter the remaining under-bump metallization (UBM) is etched utilizing the bump deposits as an etch mask, and a bump formation is performed by a reflow process that melts the alloy and forms bump balls 58 which are shown in FIG. 10 as part of a resulting structure.

Thereafter, a wafer dicing process is performed which separates the bonded wafers into single or individual filter devices, so that each filter device includes a carrier substrate carrying at least one filter and a capping substrate. The filter is disposed in at least one cavity located between the carrier substrate and the capping substrate. The resulting filter device may then be connected to a wiring substrate using a standard flip-chip technology.

If no "bumping process" is used, the wafer dicing process can be performed directly after the thinning of the wafer package. The interconnections are then produced after the wafer dicing process, for example with the help of a conventional wire bonding process wherein wires 59 are used to contact the pads 52. The resulting filter devices are shown in FIG. 11.

The filter devices shown in FIG. 10 include a capping wafer 53 that was structured to provide pad openings 54. FIG. 12 shows a filter device according to a further embodiment of the present invention wherein a carrier substrate 60 is structured to provide openings. Accordingly, the bumping process that is used to fabricate interconnections 68 is applied to a back surface of the carrier wafer.

FIG. 13 shows a filter device according to an added embodiment of the present invention. The filter device shown in FIG. 13 is similar to the filter device shown in FIG. 10 except for the fact that the acoustic wave filter of FIG. 13 includes two Bulk Acoustic Wave (BAW) resonators 51 located in the sealed cavity. This allows for a multi-band operation of the final filter device.

Figure 14:
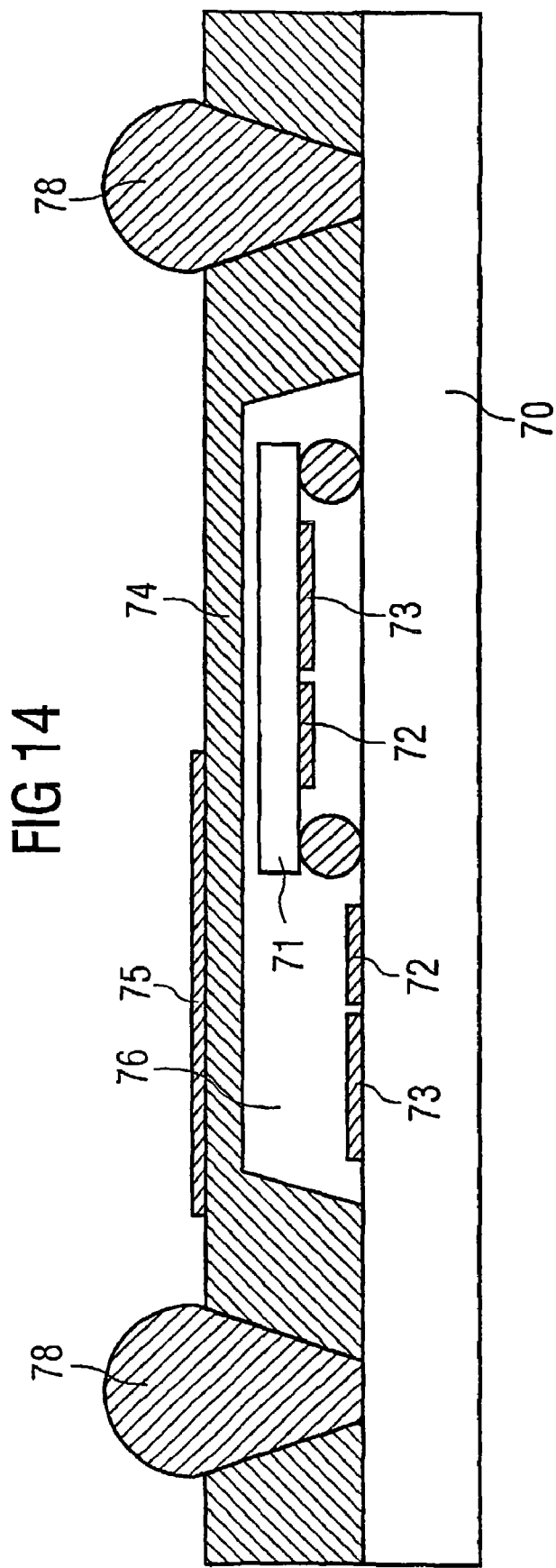
FIG. 14 is a cross-sectional view of a filter device according to an additional embodiment of the present invention.

FIG. 14 shows a filter device according to an additional embodiment of the present invention. The filter device shown in FIG. 14 includes a carrier substrate 70 and an additional substrate (chip) which are electrically and mechanically connected to the substrate 70 by a flip-chip technique. Both the carrier substrate 70 and a flip-chip-mounted substrate 71 have active or passive IC components 72 and Bulk Acoustic Wave (BAW) resonators 73 thereon. A capping substrate 74 also contains additional passive components 75, such as a coil which acts as an inductivity.

The carrier substrate 70 and the flip-chip-mounted substrate (die) 71 are covered by the capping wafer 74 and sealed within a cavity 76. The filter device shown in FIG. 14 may then be connected to a wiring substrate by a standard flip-chip technology using connections 78.

We claim:

1. A method of fabricating filter devices, which comprises the steps of:
   providing a carrier wafer carrying a plurality of filters;
   providing a capping wafer;
   bonding the capping wafer to the carrier wafer, with the filters disposed in cavities between the carrier wafer and the capping wafer; and
   separating the bonded wafers into single filter devices, each single filter device having a carrier substrate carrying at least one filter and a capping substrate, the at least one filter being disposed in at least one cavity between the carrier substrate and the capping substrate, and the the filter devices being coupled to a wiring substrate by at least one interconnection using flip-chip technology, the interconnection being a solder or metal bump.

2. The method according to claim 1, wherein the filters are acoustic wave filters.

3. The method according to claim 1, wherein the filters are surface Acoustic Wave filters.

4. The method according to claim 1, wherein the filters are sulk Acoustic Wave filters, and each Bulk Acoustic Wave filter includes at least one Bulk Acoustic Wave resonator.

5. The method according to claim 1, wherein the filters are Stacked Crystal Filters.

6. The method according to claim 1, wherein the carrier substrate further includes an integrated circuit.

7. The method according to claim 1, wherein the carrier substrate further includes a radio-frequency integrated circuit.

8. The method according to claim 1, which further comprises performing the step of bonding the capping wafer to the carrier wafer by using a direct bonding method.

9. The method according to claim 1, which further comprises performing the step of bonding the capping wafer to the carrier wafer by using an anodic bonding method.

10. The method according to claim 1, which further comprises performing the step of bonding the capping wafer to the carrier wafer by using an intermediate-layer bonding Method.

11. The method according to claim 10, which further comprises performing the intermediate-layer bonding method as an AuSi eutectic bonding method.

12. The method according to claim 1, which further comprises performing a thinning step for reducing a thickness of at least one of the capping wafer and the carrier wafer, before performing the step of separating the bonded wafers into single filter devices.

13. The method according to claim 12, which further comprises performing the thinning step by grinding at least one of the capping wafer and the carrier wafer.

14. The method according to claim 12, which further comprises performing the thinning step by etching at least one the capping wafer and the carrier wafer.

15. The method according to claim 1, which further comprises micromachining at least one of the capping wafer and the carrier wafer to provide space for the cavities.

16. The method according to claim 1, which further comprises structuring the capping wafer to provide pad openings.

17. The method according to claim 1, which further comprises producing interconnects before performing the step of separating the bonded wafers into single filter devices.

18. The method according to claim 17, which further comprises producing the interconnects as solder or metal bumps.

19. The method according to claim 1, which further comprises providing passive components on the capping wafer.

20. The method according to claim 1, which further comprises placing additional filters as flip-chips on top of the carrier wafer.

21. The method according to claim 20, which further comprises selecting the additional filters as at least one of acoustic wave filters and active/passive ICs.

22. A filter device, comprising:
a carrier substrate;
at least one filter carried by said carrier substrate;
a capping substrate;
said carrier substrate and said capping substrate defining at least one cavity therebetween containing said at least one filter; and
at least one interconnection configured for coupling the filter device to a wiring substrate using flip-chip technology, said interconnection being a solder or metal bump.

23. The filter device according to claim 22, wherein said at least one filter is an acoustic wave filter.

24. The filter device according to claim 22, wherein said at least one filter is a Surface Acoustic Wave filter.

25. The filter device according to claim 22, wherein said at least one filter is a Bulk Acoustic Wave filter including at least one Bulk Acoustic Wave resonator.

26. The filter device according to claim 22, wherein said at least one filter is a Stacked Crystal Filter.

27. The filter device according to claim 22, wherein said carrier substrate includes an integrated circuit.

28. The filter device according to claim 27, wherein said integrated circuit is a radio-frequency integrated circuit.

29. The filter device according to claim 22, which further comprises at least one contact pad for coupling said at least one filter to a wiring substrate through at least one bonding wire.

30. The filter device according to claim 22, which further comprises passive components provided on said capping substrate.

31. The filter device according to claim 22, which further comprises additional filters disposed as flip-chips on top of said carrier substrate within said at least one cavity.

32. The filter device according to claim 31, wherein said additional filters are at least one of acoustic wave filters and active/passive ICs.

* * * * *